(12) United States Patent
Nakadai et al.

(10) Patent No.: US 6,723,213 B2
(45) Date of Patent: Apr. 20, 2004

(54) TITANIUM TARGET ASSEMBLY FOR SPUTTERING AND METHOD FOR PREPARING THE SAME

(75) Inventors: Yasuo Nakadai, Chiba-ken (JP); Poong Kim, Tokyo-to (JP); Weiping Chai, Chiba-ken (JP); Masahiro Kodera, Chiba-ken (JP)

(73) Assignee: Vacuum Metallurgical Co., Ltd., Chiba-Ken (JP)

( * ) Notice: Subject to any disclaimer, the term of this patent is extended or adjusted under 35 U.S.C. 154(b) by 0 days.

(21) Appl. No.: 10/083,123

(22) Filed: Feb. 27, 2002

(65) Prior Publication Data
US 2002/0121437 A1 Sep. 5, 2002

(30) Foreign Application Priority Data
Mar. 1, 2001 (JP) ......................... 2001-056913

(51) Int. Cl.[7] .................. C23C 14/34; C23C 14/14; B05D 3/00; B23K 20/00
(52) U.S. Cl. .................. 204/298.13; 204/192.32; 427/531; 427/295; 427/248.1; 427/377; 427/383.1; 427/350; 228/193; 228/194; 228/195
(58) Field of Search .................. 204/192.32, 192.34, 204/192.15, 298.12, 298.13; 427/531, 295, 248.1, 377, 383.1, 350; 228/193, 194, 195

(56) References Cited

U.S. PATENT DOCUMENTS

| 4,951,601 A | * | 8/1990 | Maydan et al. ............ 118/719 |
| 5,595,337 A | | 1/1997 | Demaray et al. ........... 228/193 |
| 5,693,203 A | | 12/1997 | Ohhashi et al. ........ 204/298.12 |
| 6,113,761 A | | 9/2000 | Kardokus et al. ...... 204/298.13 |
| 6,199,259 B1 | * | 3/2001 | Demaray et al. ............ 29/458 |
| 6,274,015 B1 | | 8/2001 | Beier et al. ........... 204/298.12 |
| 6,521,108 B1 | * | 2/2003 | Zhang .................. 204/298.13 |

* cited by examiner

Primary Examiner—Steven H. VerSteeg
(74) Attorney, Agent, or Firm—Arent Fox, PLLC

(57) ABSTRACT

A titanium target assembly includes a titanium sputtering target, a copper or copper alloy backing plate and serving as a support member for the target and a silver or silver alloy coating film and formed between the target and backing plate. The coating film is formed on a surface subjected to cleaning treatment on the bonding side or sides of the target and backing plate by physical vapor deposition. The titanium target and backing plate are solid phase diffusion bonded. The face(s) serve as the bonding plane. The assembly can be manufactured by cleaning the surface(s) of the target and/or backing plate on bonding side(s), forming a coating film on the cleaned surface(s) on bonding side(s) and solid phase diffusion-bonding the target and backing plate, while using surface(s) provided with coated film as the bonding plane. The target assembly possesses high bonding strength and excellent bonding stability and reliability.

9 Claims, 2 Drawing Sheets

⊙: An Ag coating is applied onto the Ti/Cu bonding plane.
○: An Ag Coating is applied onto the Ti bonding plane.
(The breakage takes place within the Ag coating film at each temperature.)
△: Direct Bonding
(The breakage takes place at the Ti/Cu interface at each temperature.)
□: Ag Sheet
(The breakage takes place at both the Ti/Ag and Ag/Cu interfaces.)

⊙ : An Ag coating is applied onto the Ti/Cu bonding plane.

○ : An Ag Coating is applied onto the Ti bonding plane.
(The breakage takes place within the Ag coating film at each temperature.)

△ : Direct Bonding
(The breakage takes place at the Ti/Cu interface at each temperature.)

□ : Ag Sheet
(The breakage takes place at both the Ti/Ag and Ag/Cu interfaces.)

FIG.2

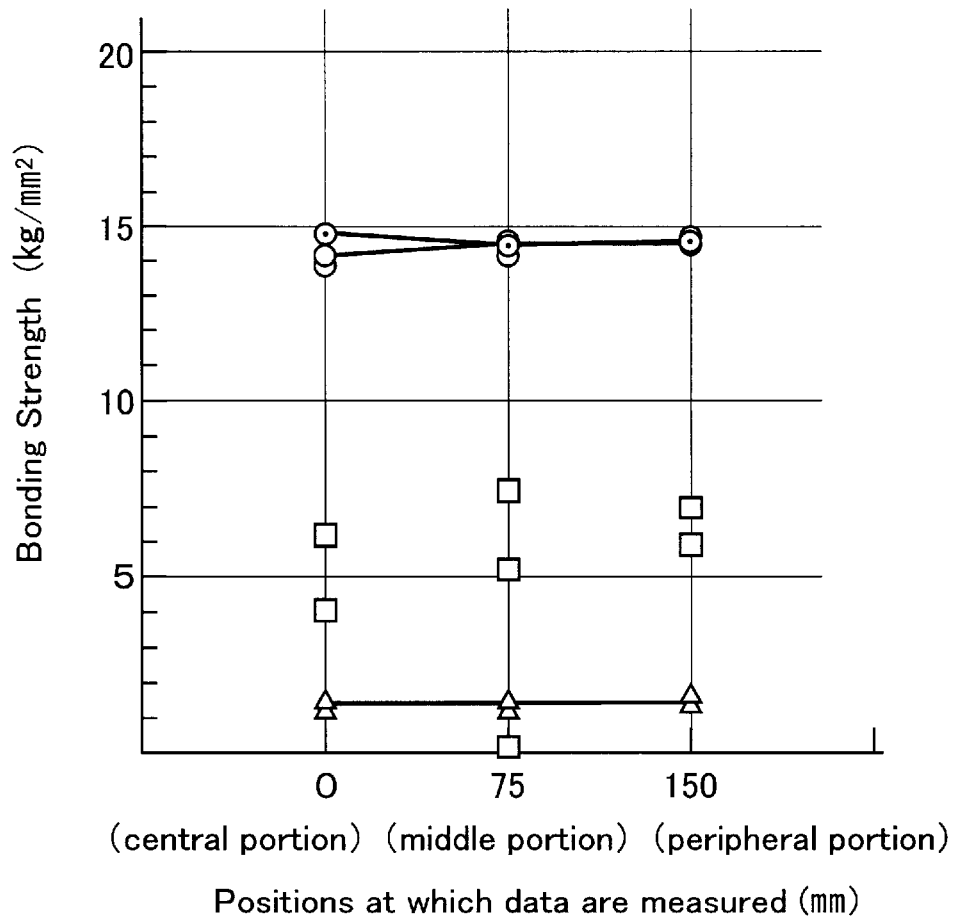

(central portion) (middle portion) (peripheral portion)

Positions at which data are measured (mm)

⊙: A coating is applied onto the Ti/Cu bonding plane.

O: An Ag Coating is applied onto the Ti bonding plane.
(The breakage takes place within the Ag coating film.)

□: Ag Sheet
(The breakage takes place at both the Ti/Ag and Ag/Cu interfaces.)

△: Direct Bonding
(The breakage takes place at the Ti/Cu interface.)

TITANIUM TARGET ASSEMBLY FOR SPUTTERING AND METHOD FOR PREPARING THE SAME

BACKGROUND OF THE INVENTION

The present invention relates to a titanium target assembly for sputtering, which has a solid phase diffusion joining (bonding) plane, and a method for preparing the same and, in particular, to a titanium target assembly for sputtering obtained by integrating a titanium (Ti) target, which constitutes a cathode used in a thin film-forming sputtering equipment, and a backing plate serving as a support for the target through a coating metal film according to the solid phase diffusion joining (bonding) technique as well as a method for preparing the same.

The sputtering target may serve as a sputtering source for forming a thin film on a substrate in the production of a variety of thin film devices including a semiconductor device. In the case of semiconductor devices, most of the targets are plates each having a disk-like shape. The sputtering target currently used is in the form of a target assembly in which a target is integrated with a support member called a backing plate used for supporting and cooling the target. When a target assembly is fitted to a sputtering cathode and then an electric power is applied to the cathode, the temperature of the target surface is raised due to the application of heat, but the heat is removed from the target by passing cooling water through the back face of the backing plate to thus control any increase of the temperature of the target surface. Materials for the backing plate commonly used are, for instance, metals and alloys thereof such as oxygen free copper, copper alloys, aluminum, aluminum alloys, titanium and titanium alloys.

Conventionally, the target and the backing plate have principally been joined through the use of a low melting brazing filler metal such as an In or Sn alloy. When a high electric power is applied for the purpose of the improvement of the throughput, however, the temperature at the interface to be joined inevitably increases despite of the cooling of the backing plate side and various problems or troubles arise such that the bonding strength is reduced due to the increase in the temperature and that the target material is in turn peeled off due to the melting of the brazing filler metal. For this reason, the joining method has been switched over to the integrated joining method, in which any brazing filler metal is not used, depending on the sputtering target. When a higher electric power is applied to the cathode for the further improvement of the throughput, however, the target undergoes changes in the characteristic properties due to the heat. Moreover, the size of the target assembly has been increased as the size of a wafer increases. This leads to the occurrence of considerable warpage of the target assembly as a joined body of different materials when such a high electric power is applied because of the difference in the coefficient of thermal expansion between these materials for the target assembly and this in turn becomes a cause of inconvenience such as the unevenness of the film thickness and changes in the film quality. Therefore, there has been desired for the appropriate selection of materials for the backing plate, while taking into consideration the control of the cooling efficiency and the warpage.

On the other hand, it has been desired for the target/backing plate assembly to satisfy such a requirement that "the crystalline structure and crystalline orientation of the target material should be maintained and the strength of the backing plate material should be ensured" and that "any deformation of the target material and the backing plate material should be controlled by reducing a joining load" upon the junction of these materials for the assembly, in addition to the foregoing control of the cooling efficiency and the warpage.

In respect of the joining method, in which any brazing filler metal is not used and which is used for producing the target/backing plate assembly, there have been filed a large number of patent applications. For instance, Japanese Un-Examined Patent Publication (hereunder referred to as "J. P. KOKAI") No. Hei 1-283367 (Japanese Patent No. 2,831,356) discloses that the target and the backing plate are directly welded under pressure without the interposition of any bonding material and lists up an explosive pressure welding technique and a seam welding technique as embodiments thereof. This patent also discloses the results obtained by the hot-rolling and diffusion joining or bonding techniques and states that good bonding strength could be achieved by these techniques.

As another direct joining method, J. P. KOKAI No. Hei 6-65733 discloses a diffusion bonding method comprising the steps of pre-heating a support member and a target member, laying one on top of the other and applying a load to these members by pressing.

As still another direct joining method, J. P. KOKAI No. Hei 9-143704 discloses a diffusion bonding method comprising the steps of bringing a titanium target material into contact with an aluminum backing plate material and then subjecting these materials to hydraulic pressing at temperatures ranging from 300 to 450° C. and pressures ranging from 50 to 200 MPa. This publication also discloses, in Examples, that a bonding strength on the order of 91 MPa (9.3 kg/mm$^2$) could be obtained under the conditions of 450° C. and 120 MPa and that a bonding strength on the order of 35 MPa (3.6 kg/mm$^2$) could be obtained under the conditions of 450° C. and 45 MPa.

As has been discussed above, there have been filed a large number of patent applications concerning the direct bonding method, but the majority thereof is limited to the combination of Ti/Al and the bonding strength of the assemblies achieved by these methods widely vary.

The inventors of the present invention applied the diffusion bonding method disclosed in J. P. KOKAI No. Hei 1-283367 (Japanese Patent No. 2,831,356), which is not seriously limited in the material for the target assembly among other techniques, to the combination of Ti (target)/Cu (backing plate) and carried out bonding tests. As a result, it was found that the bonding method provided results lacking in bonding stability and reliability and showing high scattering and more specifically, the bonding strength was found to fall within the range of from 6 to 11 kg/mm$^2$ under the conditions of a bonding temperature of 500 or 450° C. and a pressure of 40 MPa.

The inventors of this invention also attempted to directly bond the combination of Ti/Cu under the conditions of 400° C. and 100 MPa, which were selected on the basis of those disclosed in the other conventional techniques relating to the Ti/Al bonding. In any case, however, the bonding strength attained are low on the order of 1.5 kg/mm$^2$ and accordingly, this method never ensures the desired or required bonding stability and reliability at all.

On the other hand, as bonding methods, which make use of an insert material for the purpose of the reduction of the load to be applied or the reduction of the bonding temperature, there have been disclosed methods for obtaining "target assemblies each comprising a target material, an insert material and a backing plate material having a solid phase diffusion bonding interface between each neighboring two materials", in J. P. KOKAI Nos. Hei 6-108246 and Hei 6-172993. More specifically, these publications disclose that a desired assembly can be prepared by solid phase diffusion-bonding the target and backing plate materials through an insert material consisting of Ag, Cu and/or Ni at a temperature falling within the range of from 200 to 600° C. and an applied load falling within the range of from 0.1 to 20 kg/mm$^2$. In Examples of these publications, a bonding strength (or shearing strength) of 6 kg/mm$^2$ can be accomplished by bonding a Ti target material and an oxygen free copper backing plate material (J. P. KOKAI No. Hei 6-108246) or an Al alloy target material and an oxygen free copper backing plate material (J. P. KOKAI No. Hei 6-172993), using an Ag foil having a thickness of 100 μm as an insert material at a temperature of 250° C. and an applied load of 8 kg/mm$^2$. When the inventors of the present invention have conducted a test for bonding Ti and Cu using an Ag foil as an insert material according to the foregoing method, however, the resulting bonding strength is lacking in the bonding stability and reliability. More specifically, the strength widely varies within the range of from 3 to 7 kg/mm$^2$ at a temperature of 500° C. and a load of 4 kg/mm$^2$ and the bonding operation at a temperature of 450° C. and a load of 4 kg/mm$^2$ simply achieves such a strength that a sample for evaluating the bonding strength is broken during the production thereof.

As has been described above in detail, there have been known a large number of conventional techniques concerning the bonding of a target and a backing plate. If the inventors of the present invention conducted tests of bonding Ti (target) and Cu (backing plate) according to the conditions disclosed in these conventional techniques, however, it was found that the resulting assemblies did not show any high bonding strength, that they showed broad bonding strength distributions and that they were insufficient in the bonding stability and reliability.

The inventors of the present invention have thus variously investigated such results and have concluded that the following two requirements should be satisfied to obtain a target assembly showing a high bonding strength and high bonding stability and reliability:

(i) A continuum or a continued body should be formed between different metallic materials; and (ii) The formation of an intermetallic compound between the different metallic materials should be controlled.

Regarding the foregoing item (i), these different metals never undergo any mutual diffusion or interdiffusion therebetween if the metals each has not a mutual solid solubility, any continuum cannot be formed unless they cause any mutual diffusion and they are simply and mechanically bonded together. On the other hand, in respect of the foregoing item (ii), if an intermetallic compound is formed between them, the compound in itself serves as a stress concentration point since it is quite hard and brittle by nature and accordingly, the bonding stability and reliability of the resulting assembly is considerably reduced.

In fact, the results obtained by the observation of the broken-out section in the bonding test carried out according to the desired conditions indicate in conventional techniques that the metals do not undergo any sufficient mutual diffusion or that an intermetallic compound is formed.

From the foregoing, it would be concluded that the following independent and reciprocal requirements should be satisfied in order to obtain a target assembly possessing a high bonding strength and high bonding stability and reliability:

(a) Selection of materials each having a mutual solid solubility;

(b) Acceleration of mutual diffusion by a cleaning treatment of the interface; and (c) Inhibition of the formation of an intermetallic compound by the control of the processing temperature and time.

In particular, the acceleration of the mutual diffusion (b) is an essential requirement to relieve the surface barrier against the bonding and diffusion between the metals, among others.

On the other hand, in the target/backing plate assembly, it is desired, by nature, that the crystalline structure and crystalline orientation of the target material should be maintained and the strength of the backing plate material should likewise be ensured and further it is also desired that any deformation of the target material and the backing plate material should be controlled by reducing a joining load upon the junction of these materials. Accordingly, to obtain a desired target assembly, it would be desired to develop a novel joining or bonding method, which can simultaneously satisfy these requirements.

Among the foregoing conventional techniques, the invention disclosed in J. P. KOKAI No. Hei 1-283367 (Japanese Patent No. 2,831,356) suffers from a problem in that the bonding strength of the resulting target assembly is rapidly reduced when the bonding temperature is lowered, the inventions disclosed in J. P. KOKAI Nos. Hei 6-108246 and Hei 6-172993 suffer from such a problem that the bonding strength of the resulting assembly widely varies due to the incorporation of an insert material and the invention disclosed in J. P. KOKAI No. Hei 9-143704 suffers from such a problem that the materials undergo deformation by the application of a high load and the resulting bonding strength is not sufficiently high.

Moreover, the foregoing conventional techniques simply disclose the bonding strength of the resulting assemblies and these techniques never refer to the extent of the contribution of the diffusion at the boundary to the bonding or junction between the materials. It is desirable to conduct the diffusion bonding at a higher temperature in order to induce such a change in the broken boundary (due to the diffusion at the boundary) that the resulting assembly shows the bonding stability and reliability, but the bonding temperature should be reduced in order to satisfy the foregoing requirements: "inhibition of the formation of an intermetallic compound" and "the crystalline structure and crystalline orientation of the target material should be maintained and the strength of the backing plate material should likewise be ensured". In other words, reciprocal two requirements should be satisfied.

SUMMARY OF THE INVENTION

Accordingly, it is an object of the present invention to solve the foregoing problems associated with the conventional techniques in a broad sense and more specifically to provide a titanium target assembly for sputtering having a high bonding strength and high bonding stability and reliability as well as a method for preparing such an assembly according to the solid phase diffusion bonding at a low temperature and a low applied load for a short period of time.

The inventors of this invention had completed a bonding method, which can ensure sufficient solid phase diffusion at the bonding interface even under the following conditions: in a vacuum, at a low temperature and a low bonding load and for a short period of time by depositing an active metal film on the surface of the target material on the side to be bonded according to the physical vapor deposition technique to thus cover the surface and already filed a patent application: Japanese Patent Application Serial No. 2000-72380 (filing date: Heisei 12 Mar. 15, 2000.

The titanium target assembly for sputtering and the method for preparing the same according to the present invention have been completed by expansively developing the invention disclosed in the foregoing earlier filed patent application.

According to an aspect of the present invention, there is provided a titanium target assembly, which comprises a sputtering target composed of high purity titanium, a backing plate composed of copper or a copper alloy and serving as a support member for the target and a coating film composed of silver or a silver alloy and formed and sandwiched between the target and the backing plate, wherein the coating film is formed on the surface subjected to a cleaning treatment on the bonding side of the target or on the bonding sides of the target and the backing plate according to the physical vapor deposition technique and the titanium target and the backing plate are solid phase diffusion bonded, while the face(s) provided with the coating film serves as the bonding plane.

According to another aspect of the present invention, there is provided a method for preparing a titanium target assembly for sputtering by bonding a sputtering target composed of high purity titanium and a backing plate composed of copper or a copper alloy and serving as a support member for the target to thus give a titanium target assembly for sputtering and the method comprises the steps of (1) treating the surface of the target and/or the backing plate on the bonding side(s) thereof with inert gas plasma according to the sputter etching technique or the ion bombardment technique to thus make the bonding surface(s) clean, (2) forming a coating film composed of silver or a silver alloy on the cleaned bonding surface(s) by the physical vapor deposition (PVD) technique without opening to the atmosphere and immediately after the completion of the cleaning step and (3) solid phase diffusion-bonding the target and the backing plate through the surface(s) provided with the coating film to thus form a titanium target assembly having a solid phase diffusion bonding plane.

BRIEF DESCRIPTION OF THE DRAWINGS

FIG. 2 is a graph showing the bonding strength distribution observed when joining Ti and Cu materials or the bonding strength observed at the central, middle and peripheral portions of the assembly of the present invention, the resulting data being compared with those observed for the conventional assembly.

DESCRIPTION OF THE PREFERRED EMBODIMENTS

Figure 1:
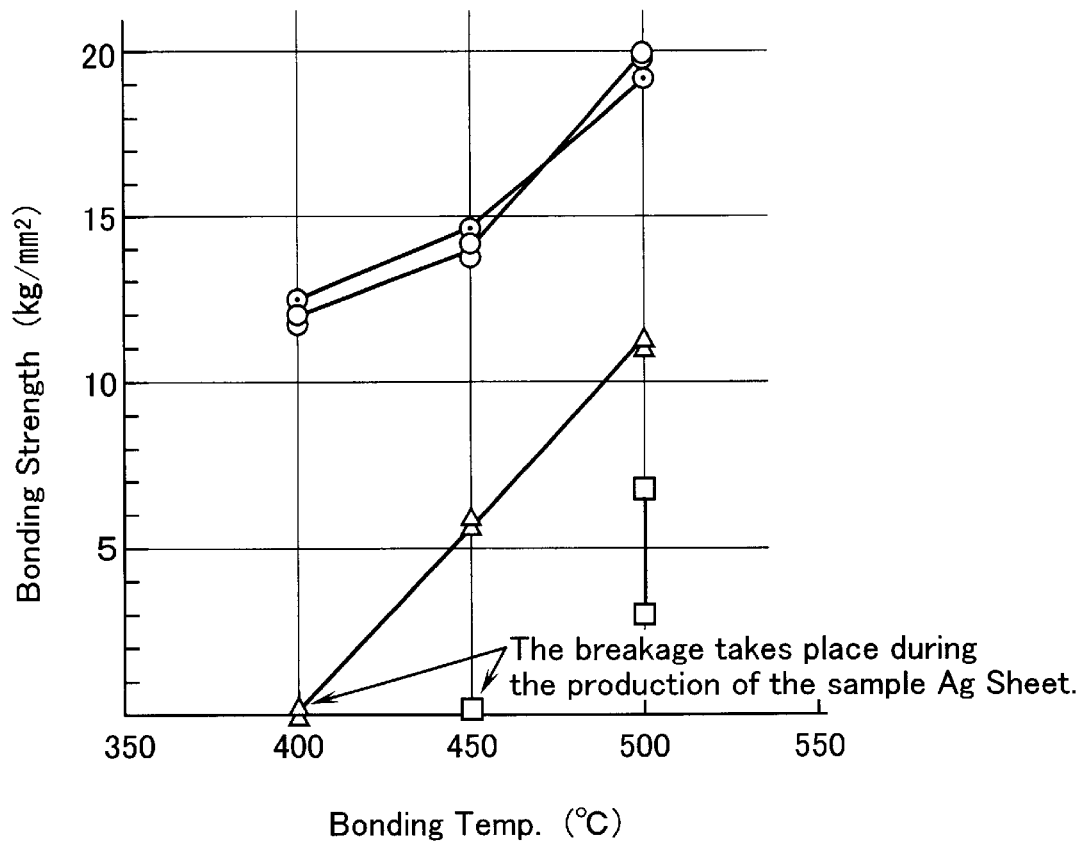
FIG. 1 is a graph showing the relation between the temperature for bonding Ti/Cu and the bonding strength of the resulting assembly according to the present invention, the resulting data being compared with those observed for the conventional assembly.

In the present invention, it is preferred that the thickness of the coating film of silver or a silver alloy is not less than 0.5 $\mu$m and not more than 10 $\mu$m and that the foregoing solid phase diffusion bonding step is carried out in a vacuum atmosphere of not more than 0.1 Pa, at a bonding temperature of not less than 400° C. and not more than 450° C., at a load applied to the materials upon bonding them of not less than 40 MPa and not more than 100 MPa for a bonding time within 2 hours. The method of the present invention permits the production of a sputtering target assembly, even under such gentle bonding conditions. The resulting assembly comprises a high purity Ti target and a Cu or a Cu alloy backing plate, which are firmly diffusion bonded at a shearing strength of not less than 10 kg/mm$^2$ and it is not broken at the interface between these materials.

Regarding the thickness of the Ag thin film, if it is less than 0.5 $\mu$m, the resulting film often has uneven thickness or a distribution in the thickness, while if it exceeds 10 $\mu$m, the strain within the resulting film is relieved. Therefore, the thickness thereof is desirably not less than 0.5 $\mu$m and not more than 10 $\mu$m. Moreover, if a vacuum atmosphere of higher than 0.1 Pa is used, the silver or silver alloy coating film is oxidized on the surface thereof and this results in the formation of a diffusion barrier at the bonding interface. Further, if the bonding temperature is less than 400° C., the resulting sputtering target assembly has a reduced bonding strength, while if the temperature exceeds 450° C., the materials for the assembly are liable to cause deformation during the bonding operation. In addition, if the load applied upon bonding is less than 40 MPa, the materials for the assembly hardly cause the desired diffusion bonding, while if it exceeds 100 MPa, the backing plate is liable to cause deformation. Furthermore, if the bonding time exceeds 2 hours, the diffusion sometimes excessively proceeds. This in turn results in an increase in the probability of forming an intermetallic compound and the reduction of productivity.

Steps quite important in the present invention are as follows: the step for subjecting the surface of the target on the bonding side or the surfaces of the target and the backing plate on the bonding sides to a cleaning treatment using plasma of an inert gas such as Ar according to, for instance, the sputter etching technique and the step for forming the Ag or Ag alloy coating film on the cleaned surface(s) on the bonding side(s) according to the physical vapor deposition (PVD) technique, immediately after the completion of the cleaning step. As a result, the mutual diffusion of the materials is easily taken place even at a lower temperature, under a lower load within a shorter period of time and the resulting assembly shows a sufficiently high bonding strength. Typical examples of such physical vapor deposition techniques are vacuum evaporation deposition, sputtering and ion plating techniques. According to these filmforming techniques, the film per itself is bonded to the material to be coated in a highly cleaned condition and thus the adhesion strength-of the assembly is also high. In particular, if the surface of the target material or those of the target and backing plate materials are cleaned with ions prior to the formation of a desired film, a clean surface is obtained, the adhesion of these surfaces to the Ag or Ag alloy thin film is considerably improved and the mutual diffusion between Ti, Ag and Cu materials easily proceeds at the bonding temperature.

The thin Ag or Ag alloy film applied onto the bonding surface(s) according to the method of the present invention includes a high internal strain therein and therefore, the mutual diffusion initiating temperature at the Ti—Ag and Ag—Cu interfaces is substantially reduced. This phenomenon is identical, in principle, to the reduction of the recrystallization temperature depending on the degree of plastic forming. For this reason, the use of such a silver or silver alloy thin film thus deposited or coated would permit the reduction of the bonding temperature as compared with that observed when using an insert of a foil and consequently, the formation of any intermetallic compound is likewise inhibited.

The present invention will hereunder be described in more detail with reference to the following Examples and Comparative Examples, but the present invention is not restricted to these specific Examples at all.

EXAMPLE 1

A titanium (Ti: purity 99.995%) target material (a disk-like plate having a diameter (ø) of 300 mm) and a copper backing plate material having the same size were subjected to ultrasonic degreasing and washing in acetone. After the completion of the washing, the surface of the target material on the bonding side thereof or the surfaces of the target and backing plate materials on their bonding sides were subjected to a cleaning treatment through the ion bombardment in an Ar atmosphere (cleaning conditions: a pressure in an Ar atmosphere of 0.7 Pa; an applied electric power of 2 kW; and a cleaning time of 30 minutes) and then an Ag coating film was formed on these surfaces, without opening them to the atmosphere and immediately after the cleaning treatment, according to the physical vapor deposition technique (conditions for the physical vapor deposition: a pressure in the Ar atmosphere of 0.4 Pa; an applied electric power of 3 kW; and a film-forming velocity of 0.1 $\mu$m/min). Then the target material and the backing plate material were solid phase diffusion-bonded under the conditions as shown in FIG. 1, while using the plane(s) provided with the coated film as the bonding plane(s). Among these bonding conditions, the degree of vacuum, bonding time and applied load were set at constant levels of 0.01 Pa, 2 hours and 40 MPa, respectively and the bonding methods selected herein were the following three methods: the conventional direct bonding method, a method, which makes use of an Ag sheet (an Ag foil having a thickness of 10 $\mu$m) as an insert, and the method according to the present invention, which makes use of the foregoing coated film. The differences in these methods were examined from the viewpoint of the influence of the bonding temperatures (400° C., 450° C. and 500° C.) on the bonding strength of the resulting target assemblies. The results thus obtained are plotted on FIG. 1 and the breaking modes of the assemblies are also shown in FIG. 1.

As will be clear from the data plotted or shown in FIG. 1, if the bonding planes of the materials are cleaned by the bombardment and immediately thereafter, coated with Ag according to the physical vapor deposition technique without opening the equipment to the atmosphere as in the present invention, the breakage of the resulting assembly took place within the Ag coated film at all of the temperatures examined. This fact indicates that the materials for the assembly undergo satisfactory diffusion at the interface thereof. Moreover, the bonding strengths of the resulting assemblies were also found to be sufficient or acceptable on the order of not less than 10 kg/mm². Contrary to this, the conventional direct bonding method permitted the production of an assembly having a relatively high bonding strength at a bonding temperature of 500° C., but the assemblies bonded at a low bonding temperature such as 400 and 450° C. showed low bonding strengths and the breakage of the assembly took place at the Ti/Cu interface at all of the bonding temperature examined. On the other hand, the assembly produced according to the bonding method using the Ag sheet as an insert underwent breakage at both the Ti/Ag and Ag/Cu interfaces and the bonding strength thereof was considerably low or undetectably low at all of the bonding temperature examined.

In addition, in the foregoing three methods, the bonding temperature, degree of vacuum, bonding time and applied load were set at constant levels of 400° C., 0.01 Pa, 2 hours and 100 MPa, respectively in order to thus examine the influence of the difference in the bonding method on the bonding strength distributions. In this respect, the bonding strengths were determined at the central portion (the center of the target having a diameter of 300 mm: zero mm), a middle portion (existing at the distance 75 mm from the target center of the assembly) and the peripheral portion (existing at the distance 150 mm from the center of the assembly). The results thus obtained are plotted on FIG. 2 and the breaking modes of the assemblies are also shown in FIG. 2.

As will be clear from the data plotted or shown in FIG. 2, if the bonding planes of the materials to be bonded are cleaned by the bombardment and immediately thereafter, coated with Ag according to the physical vapor deposition technique without opening the equipment to the atmosphere as in the present invention, the breakage of the resulting assembly took place within the coated film of Ag. This fact clearly indicates that the materials for the assembly undergo satisfactory diffusion at the interface thereof. Moreover, the bonding strength of the resulting assembly was found to be uniform throughout the assembly and also found to be sufficient or acceptable on the order of not less then 14 kg/mm². Contrary to this, the conventional direct bonding method simply provided an assembly having a considerably low bonding strength and the breakage of the assembly took place at the Ti/Cu interface. On the other hand, the assembly produced according to the bonding method using the Ag sheet as an insert underwent breakage at both the Ti/Ag and Ag/Cu interfaces and the bonding strength thereof was considerably low at each measuring point and widely varied or showed scatter.

According to the present invention, the effects listed below can be accomplished by applying a PVD coated film of Ag or an Ag alloy onto a target consisting of Ti and a backing plate consisting of Cu or a Cu alloy in the diffusion-bonding of the target and the backing plate:

1) The coated film material has a high melting point as compared with that of the conventionally used brazing filler metal and therefore, the film material never has any bad influence upon the production processes such as the melting out thereof.
2) The diffusion-initiating temperature at the interface is reduced by applying Ag or Ag alloy thin film having a high internal strain onto the bonding planes, which is cleaned by the sputter etching or ion bombardment technique using plasma of an inert gas such as Ar and therefore, a high bonding strength of the resulting assembly can be ensured at a low load and a low bonding temperature for a short period of time.
3) The materials for the assembly can be joined at a low temperature and therefore, any strength reduction of the Cu-containing backing plate material can be prevented.
4) The materials for the assembly can be joined at a low temperature and a low applied load and accordingly, any plastic deformation of the Cu-containing backing plate material per se can be inhibited during the bonding operation.
5) A Ti target and a Cu alloy backing plate can be diffusion-bonded at a low temperature and this in turn permits the improvement of the cooling efficiency and the control of the warpage of the resulting assembly upon application of an electric power, as compared with the conventional assembly obtained by diffusion-bonding an Al alloy backing plate.

What is claimed is:
1. A titanium target assembly comprising a sputtering target of titanium, a backing plate composed of copper or a copper alloy and serving as a support member for said target and a coating film composed of silver or a silver alloy and formed between said target and said backing plate, wherein said coating film is formed on a surface subjected to a cleaning treatment on a bonding side of said target or on bonding sides of said target and said backing plate according to a physical vapor deposition technique and said target and said backing plate are solid phase diffusion bonded, while face(s) provided with said coating film serves as a bonding plane.

2. A method for preparing a titanium target assembly for sputtering by bonding a sputtering target of titanium and a backing plate composed of copper or a copper alloy and serving as a support member for said target to thus give a titanium target assembly for sputtering, which comprises the steps of:

(1) treating a surface of said target and/or said backing plate on bonding side(s) thereof with inert gas plasma according to a sputter etching technique or an ion bombardment technique to thus make bonding surface(s) clean;

(2) forming a coating film composed of silver or a silver alloy on said cleaned bonding surface(s) by a physical vapor deposition technique without opening to an atmosphere and immediately after completion of a cleaning step (1) and (3) solid phase diffusion-bonding said target and said backing plate through surface(s) provided with said coating film to thus form a titanium target assembly having a solid phase diffusion plane.

3. The method for preparing a titanium target assembly for sputtering as set forth in claim 2, wherein said coated film of silver or silver alloy has a thickness of not less than 0.5 $\mu$m and not more than 10 $\mu$m.

4. The method for preparing a titanium target assembly for sputtering as set forth in claim 3, wherein said solid phase diffusion-bonding step is carried out in a vacuum atmosphere of not more than 0.1 Pa, at a bonding temperature of not less than 400° C. and not more than 450° C. and a load applied during the bonding step of not less than 40 MPa and not more than 100 MPa for a bonding time falling within 2 hours.

5. The method for preparing a titanium target assembly for sputtering as set forth in claim 4, wherein said physical vapor deposition technique is selected from vacuum evaporation deposition, sputtering and ion plating techniques.

6. The method for preparing a titanium target assembly for sputtering as set forth in claim 3, wherein said physical vapor deposition technique is selected from vacuum evaporation deposition, sputtering and ion plating techniques.

7. The method for preparing a titanium target assembly for sputtering as set forth in claim 2, wherein said solid phase diffusion-bonding step is carried out in a vacuum atmosphere of not more than 0.1 Pa, at a bonding temperature of not less than 400° C. and not more than 450° C. and a load applied during the bonding step of not less than 40 MPa and not more than 100 MPa for a bonding time falling within 2 hours.

8. The method for preparing a titanium target assembly for sputtering as set forth in claim 7, wherein said physical vapor deposition technique is selected from vacuum evaporation deposition, sputtering and ion plating techniques.

9. The method for preparing a titanium target assembly for sputtering as set forth in claim 2, wherein said physical vapor deposition technique is selected from vacuum evaporation deposition, sputtering and ion plating techniques.

* * * * *